(12) United States Patent
Beach et al.

(10) Patent No.: US 6,670,800 B2
(45) Date of Patent: Dec. 30, 2003

(54) TIMING VARIATION MEASUREMENTS

(75) Inventors: Chad Beach, Fair Oaks, CA (US); Salem Abdennadher, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 10/142,645

(22) Filed: May 8, 2002

(65) Prior Publication Data

US 2003/0210028 A1 Nov. 13, 2003

(51) Int. Cl.[7] ............... G06M 1/10; G01R 23/12; H04B 17/00
(52) U.S. Cl. ............... 324/76.16; 324/76.53; 324/76.77; 375/226; 375/376
(58) Field of Search ............... 324/76.16, 76.53, 324/76.77; 375/226, 376

(56) References Cited

U.S. PATENT DOCUMENTS 4,164,648 A * 8/1979 Chu ............... 377/20
5,663,991 A 9/1997 Kelkar et al.
5,793,822 A 8/1998 Anderson et al.
6,295,315 B1 9/2001 Frisch et al.

OTHER PUBLICATIONS

Sunter, S., Aubin, R., "BIST for Phase–Locked Loops in Digital Applications, " Jan. 1999, IEEE, LogicVision, Inc., Ottawa, Canada, pp. 532–540.

* cited by examiner

*Primary Examiner*—N. Le
*Assistant Examiner*—Timothy J. Dole
(74) *Attorney, Agent, or Firm*—Fish & Richardson P.C.

(57) ABSTRACT

Measuring timing variations in a periodic signal includes producing trigger signals in an integrated circuit in response an externally-generated periodic signal. First and second oscillation signals are generated in response to the trigger signals. A first count of the number of pulses in the first oscillation signal from occurrence of the first oscillation signal until the oscillation signals are in phase and providing a second count of the number of pulses in the second oscillation signal from occurrence of the second oscillation signal until the oscillation signals are in phase.

11 Claims, 4 Drawing Sheets

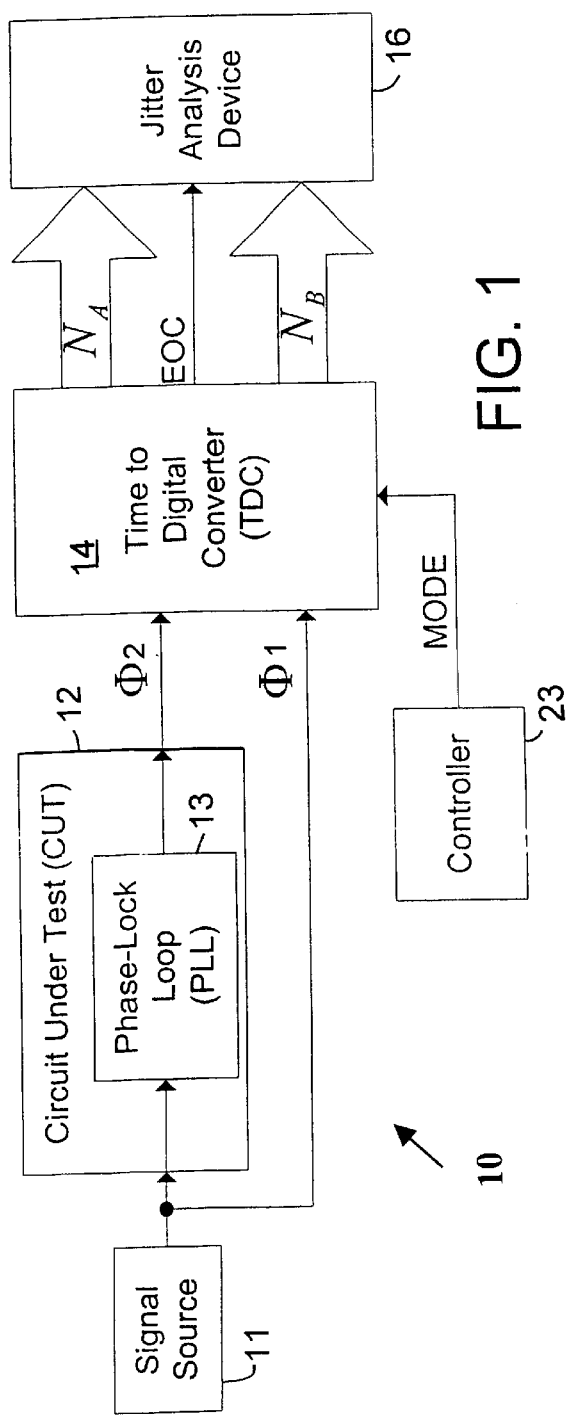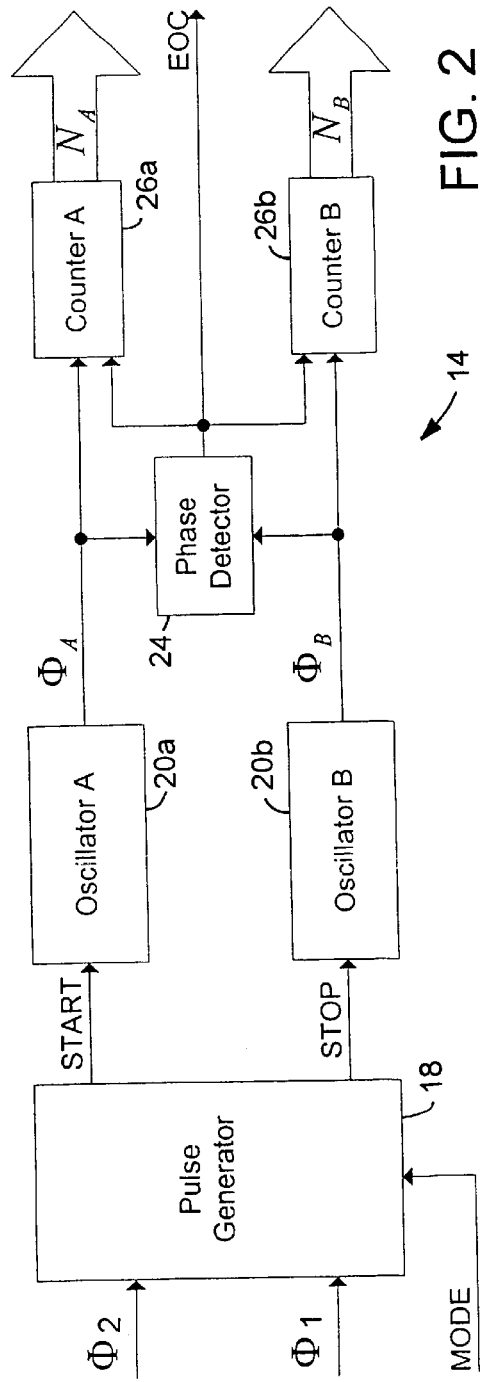

# TIMING VARIATION MEASUREMENTS

BACKGROUND

This invention relates to timing variation measurements.

Phase lock loop (PLL) circuits are used in a wide variety of applications such as frequency synthesis, timing recovery, clock distribution and phase demodulation. Those applications are sometimes employed, for example, in optical fiber links, wireless telephones and computers. Timing variations of the PLL circuits, such as the jitter, can adversely affect the performance of the PLL circuits and the application in which the PLL circuits are used. Thus, accurate and cost effective measurement of such timing variations or jitter is critical to current high-speed applications.

BRIEF DESCRIPTION OF THE DRAWINGS

FIG. 1 is a block diagram of a timing variation measurement system.

FIG. 2 is a block diagram of a time to digital converter.

DETAILED DESCRIPTION

Figure 3:
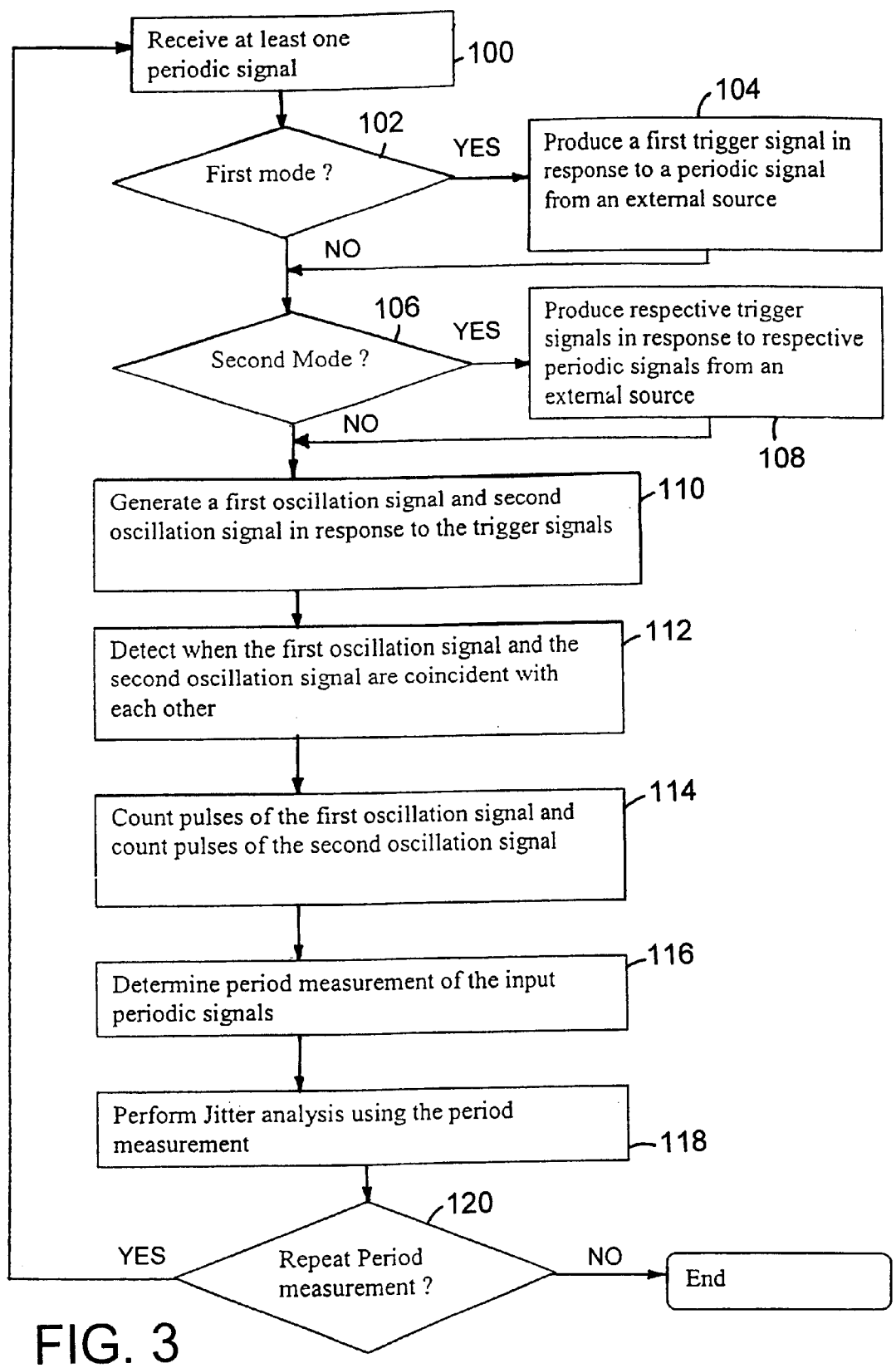
FIG. 3 is a flow chart of a process of measuring timing variations.

Referring to FIG. 1, a measurement system 10 can be used to measure timing variations, such as jitter, in a periodic signal waveform. A time-to-digital converter (TDC) 14 receives input periodic waveforms and extracts timing information that can be used to determine timing variations associated with the input waveform. In one embodiment, the TDC 14 is implemented as an integrated circuit (IC) that measures timing variations of a signal waveform provided by a PLL 13 that forms a part of a chip under test (CUT) 12. The TDC 14 also can be implemented as an IC separate from the IC that includes the CUT 12. Similarly, the CUT 12 may be implemented as an IC or may be part of a larger system including multiple ICs. Such a CUT 12 can include an IC having a multiple channel T1/E1 transceiver circuit.

In operation, the PLL 13 receives a first periodic signal $\Phi_1$ from a signal source 11 and generates a second periodic signal $\Phi_2$ with a frequency and phase that corresponds to the first periodic signal $\Phi^1$. The signals are provided to the TDC 14. The TDC 14 may be used to provide data indicative of jitter in periodic signal waveforms provided by other sources. An external controller 23 can send signals to the TDC 14 to configure the TDC to operate in two modes. In a first mode, the TDC 14 is capable of providing data indicative of periodic jitter associated with the first periodic signal $\Phi_1$. In a second mode, the TDC 14 can provide data indicative of relative jitter between the first periodic signal $\Phi_1$ and the second periodic signal $\Phi_2$.

TDC 14 produces output signals corresponding to a first count $N_A$ and a second count $N_B$. The counts represent timing information associated with the respective periodic signals $\Phi_1$, $\Phi_2$. The TDC 14 can repeatedly produce count data $N_A$, $N_B$ that is delivered to a jitter analysis device 16 such as automatic test equipment (ATE). The TDC generates a termination signal EOC to the jitter analysis device 16 to indicate that a measurement has been performed. The jitter analysis device 16 can generate a histogram based on the repeated measurement data representing timing variations, such as jitter, of the signal waveform. In one embodiment, the functionality of the jitter analysis device 16 can be incorporated in the TDC 14.

Referring to FIG. 2, the TDC 14 includes a pulse generator 18, oscillators 20a, 20b, a detector 24 and a counter 26 having counters 26a, 26b. A mode selection signal MODE from the controller 23 can place the pulse generator 18 in a first mode of operation in which periodic jitter associated with the first periodic signal $\Phi_1$ is measured. Alternatively, the pulse generator 18 can be placed in a second mode of operation in which relative jitter between the first periodic signal $\Phi_1$ and the second periodic signal $\Phi_2$ is measured. The pulse generator 18 can implement the dual mode selection function, for example, using a multiplexer to select between the two modes of operation based on the received mode selection signal MODE.

Referring to FIGS. 2 and 3, operation of the system 10 is explained. The TDC 14 receives 100 one or more periodic signals $\Phi_1$, $\Phi_2$ that are generated externally to the TDC.

Figure 4:
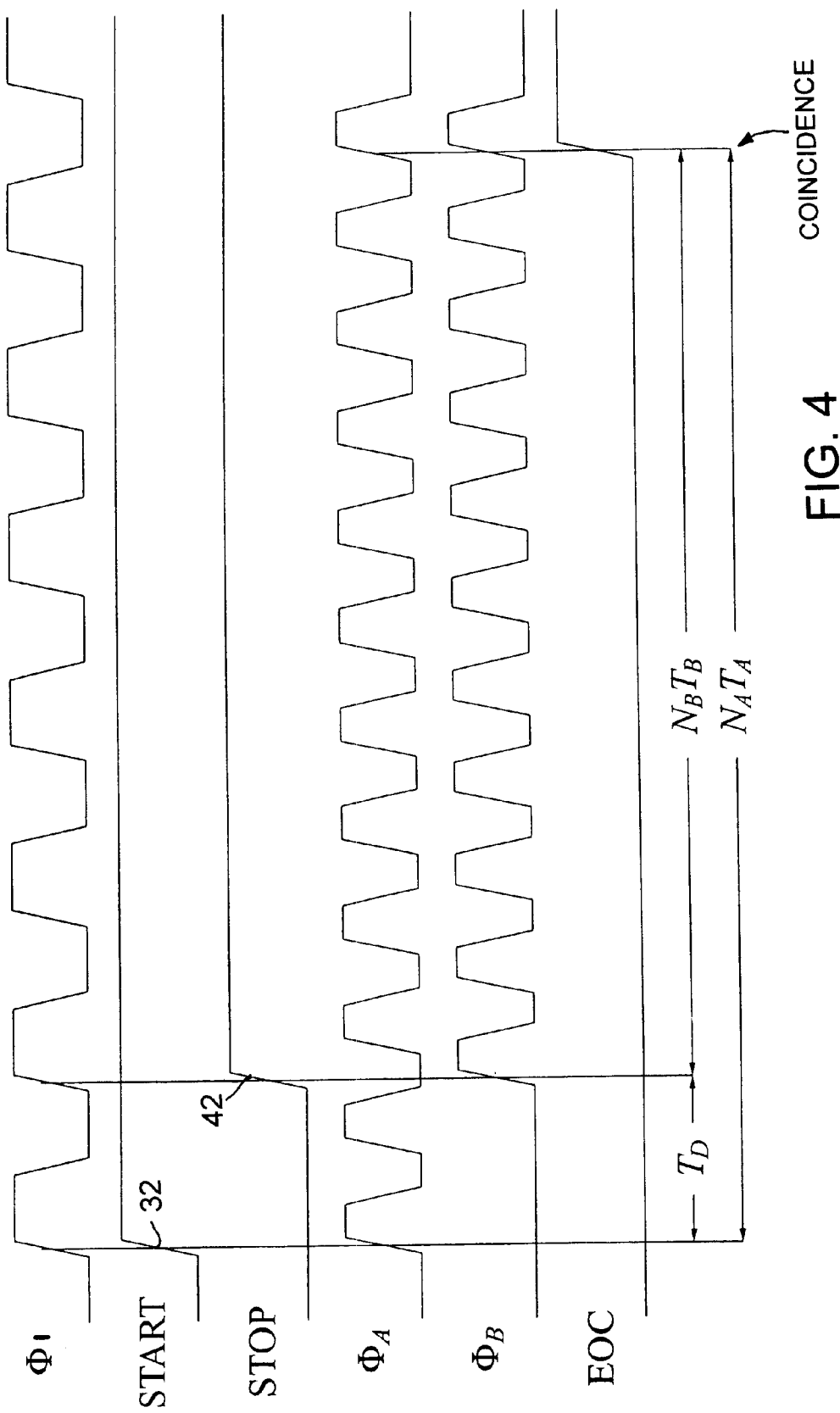
FIG. 4 is a signal-timing diagram in relation to a timing variation measurement system.

A query is made 102 as to whether the TDC 14 is operating in a first mode, and if so, then a first trigger signal START and a second trigger signal STOP are generated 104 by the pulse generator 18 in response to the periodic signal $\Phi_1$ (see FIG. 4). Operating in the first mode allows jitter associated with the periodic signal to be measured.

In the first mode of operation, the first trigger signal START is fed to the oscillator 20a which causes a first oscillation signal $\Phi_A$ to be generated 110 in response to the leading edge 32 of the first trigger signal START. Also, a second oscillation signal $\Phi_B$ is generated in response to the first trigger signal START.

On the other hand, if the TDC 14 is not operating in the first mode, then a query is made 106 as to whether the TDC 14 is operating in a second mode. If the results of the query indicate that the TDC 14 is operating in the second mode, then a first trigger signal START is generated 108 in response to the first periodic signal $\Phi_1$. In addition, a second trigger signal STOP is generated in response to the second periodic signal $\Phi_2$. Operating in the second mode permits a relative jitter measurement to be performed, including measuring the relative timing variations between the first periodic signal $\Phi_1$ and the second periodic signal $\Phi_2$.

In the second mode of operation, as in the first mode of operation, the first trigger signal START is fed to the oscillator 20a which causes a first oscillation signal $\Phi_A$ to be generated in response to the leading edge 32 of the first trigger signal START (see FIG. 4).

In the second mode of operation, a second oscillation signal $\Phi_B$ is generated 110 in response to the edge 42 of the second trigger signal STOP.

The oscillation signals $\Phi_A$, $\Phi_B$ are generated by the oscillators 20a, 20b causing each counter 26a, 26b to begin counting the pulses associated with a respective one of the oscillation signals.

The detector 24 detects 112 when the oscillation signals $\Phi_A$, $\Phi_B$ are in phase, also known as coincidence of signals, and generates termination signal EOC to the counter 26a, 26b. Coincidence occurs when the leading edges of the oscillator signals $\Phi_A$, $\Phi_B$ are in phase. The termination signal EOC causes the counters 26a, 26b to stop counting pulses of the oscillation signals $\Phi_A$, $\Phi_B$.

Once the counters 26a, 26b stop counting pulses, the counter 26 produces 114 count values $N_A$, $N_B$ reflecting the number of pulses counted. Each count value $N_A$, $N_B$ represents the number of pulses that occurred since the occurrence of the trigger signals START, STOP until the occurrence of a coincidence.

Each count value $N_A$, $N_B$ can be used to determine 116 a period TD associated with one of the oscillation signals $\Phi_A$, $\Phi_B$. In particular, the jitter analysis device 16 (FIG. 1) uses the counts $N_A$, $N_B$ to determine the period TD of the first periodic signal $\Phi_1$. The period TD may be determined, for example, by the following equation:

$$TD=(N_A*TA)-(N_B*TB) \qquad (1)$$

in which $N_A$, $N_B$ are the count values associated with the first and second oscillation signals $\Phi_A$, $\Phi_B$ and T1, T2 are the periods of the first and second oscillation signals $\Phi_A$, $\Phi_B$, respectively. In the illustrated example (FIG. 4), the period of the first oscillation signal $\Phi_A$ is greater than the period of the second oscillation signal $\Phi_B$, and the counts $N_A$, $N_B$ are equal, which reduces equation (1) to:

$$TD=N_A*(TA-TB) \qquad (2)$$

Once the period TD is calculated, jitter analysis is performed 118. In some applications, it may be necessary to perform multiple period measurements and calculations of period TD to determine jitter or timing variations associated with the periodic signals $\Phi_1$, $\Phi_2$. For example, to accurately determine jitter in a T1-line application, it may be necessary to perform approximately three-hundred period measurements. The jitter analysis device 16 can generate a histogram of the calculated periods TD.

Figure 5:
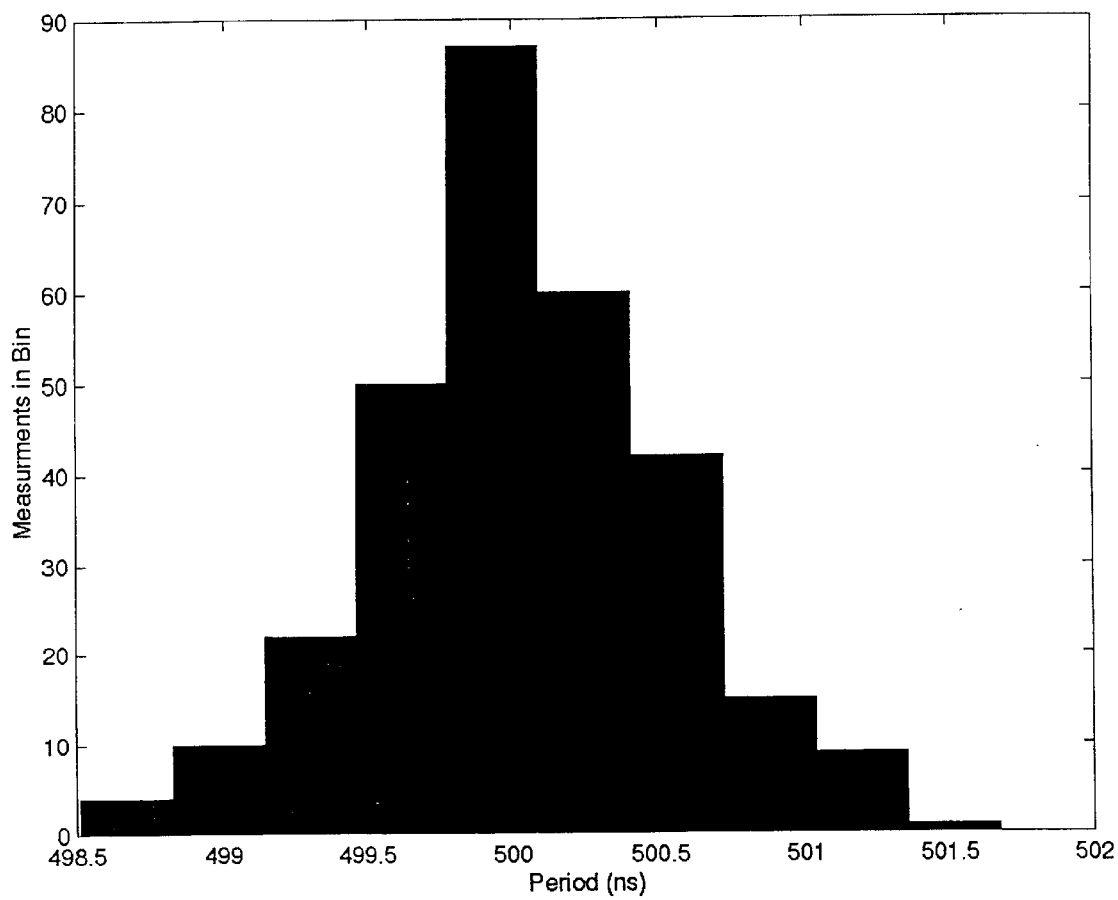
FIG. 5 is a histogram showing measurements of a periodic signal waveform.

FIG. 5 shows an example of a histogram 70 for periods TD. The histogram 70 can provide information regarding the distribution of timing variations of the periodic signals. For example, it can provide insight regarding whether the jitter distribution has a gaussian distribution and then allow various metrics to be calculated such as root mean square (RMS), average jitter, minimum and maximum jitter, standard deviation and variance. The metrics then can be compared to established specifications to determine whether the component meets the specifications.

At 120, a query is made as to whether additional measurements are necessary. If the results of the query indicate that additional measurements are necessary, then the foregoing process is repeated by starting at block 100.

The TDC 14 may be employed in connection with built-in self test (BIST) or designed for test (DFT) components of larger ICs such as application specific circuits (ASICs), field programmable gate arrays (FPGAs), as well as ICs that include PLLS.

In one embodiment, the TDC 14 is implemented in a FPGA separate from the IC that includes the source of the periodic signal. The FPGA includes development tools that facilitate designing the physical layout of the oscillator and the interconnections between components on the FPGA. An example of a FPGA is the 10K30 FPGA and corresponding Max Plus II development tools from Altera Corporation. The frequency of the periodic waveform that the TDC 14 can process may be limited by the signal delay from a pin outside the FPGA to a component inside the FPGA, the speed of flip-flops that make up the oscillator, and other delays in the FPGA.

For example, in a particular FPGA oscillator, an oscillator period of a first oscillator was found to be approximately 19.910 nanoseconds with a standard deviation of 20 picoseconds. The oscillator period of a second oscillator was found to be approximately 19.680 nanoseconds with a standard deviation of 11 picoseconds. The minimum resolution of an oscillator in a TDC is determined by the difference between the periods of the oscillation signals which, in this particular example, is approximately 230 picoseconds. This is the minimum jitter that the TDC can detect in a periodic waveform.

The resolution and accuracy of a TDC can be improved to the extent the frequencies of the delay elements of the oscillators are matched. As discussed above, calculations of period measurements are based in part, upon the difference in the periods of the oscillation signals provided by oscillators. The smaller the difference between these frequencies, the greater the resolution in the measurement. The frequencies are considered substantially matched if the difference in frequencies is less than about one percent, and in some implementations, by no more than one-tenth of one percent. Such close matching of the frequencies is better achieved when the oscillators are designed and physically placed on an ASIC rather than on an FPGA.

Matching of oscillator periods on a common circuit substrate can be enhanced further by optional implementations that mitigate the effects of temperature sensitivities of the delay elements of the oscillators and the power supply voltages supplied to the oscillators. A common power supply for the oscillators in FPGA implementations prevents frequency variations between oscillators that can arise from incidental variations in operation of different power supplies. The interconnect delays and the physical layout of oscillators in a FPGA can be controlled to permit greater oscillator stability.

Providing separate substrates for the TDC and the CUT may permit the TDC to be less susceptible substrate noise in CUT. As a result, the TDC may provide an increase in the accuracy of periodic signal measurements including periodic and relative jitter measurements. In addition, having a TDC separate from the CUT may permit a reduction in the design cycle time of the CUT. For example, the design of the TDC may no longer be a bottleneck during the design of the CUT.

The foregoing techniques provide a flexible approach to jitter analysis. For example, the interface between the TDC and an ATE can be flexible and allow the interface to be customized using, for example, a serial interface to communicate between the TDC and the ATE. If the TDC is implemented on an FPGA, then it can be debugged and redesigned while it is installed in-system. Moreover, an interface to the TDC can allow an ATE to program the TDC to perform various timing measurements other than jitter measurements such as bitstream decoding and encoding. In addition, the TDC can be used during the testing phase so that only a few FPGAs are required, thereby resulting in a reduction in the cost of testing.

The TDC 14 can be used to reduce the time involved in conducting a jitter measurement in a CUT having multiple signals or channels. For example, a CUT such as T1/E1 transceiver IC can include multiple output channels each of which is driven by a PLL. By using multiple TDCs in parallel to measure each individual channel, the time to test the transceiver IC can be reduced. As a result, test measurement throughput can be increased.

Similarly, by incorporating the TDC in an IC separate from the IC incorporating the CUT can allow more real estate on the CUT to be used for other functions. Moreover, because the TDC is able to measure jitter characteristic in high-speed applications, there may be an increase in yield due to more accurate jitter measurements.

Other implementations are within the scope of the following claims.

What is claimed is:

1. A method comprising:

producing trigger signals in an integrated circuit in response to an externally-generated periodic signal;

generating first and second oscillation signals in response to the trigger signals;

determining when the first and second oscillation signals are in phase; and providing a first count of the number of pulses in the first oscillation signal from occurrence of the first oscillation signal until the oscillation signals are in phase and providing a second count of the number of pulses in the second oscillation signal from occurrence of the second oscillation signal until the oscillation signals are in phase, wherein a pulse generator produces the trigger signals in response to receiving a pair of periodic signals generated externally to the integrated circuit, and wherein the first count and the second count are indicative of relative jitter associated with the pair of periodic signals.

2. The method of claim 1 comprising providing an output signal when leading edges of the first and second oscillation signals are in phase.

3. The method of claim 1 comprising providing an output signal when trailing edges of the first and second oscillation signals are in phase.

4. An apparatus comprising:

a pulse generator to produce trigger signals in response to receiving an externally-generated periodic signal;

an oscillator coupled to the pulse generator to generate a first and second oscillation signals in response to the trigger signals;

a detector coupled to the oscillator to provide an output signal when the first and the second oscillation signals are in phase; and a counter coupled to the oscillator and the detector to receive the first and second oscillation signals and the output signal and to provide a first count of the number of pulses in the first oscillation signal from receipt of the first oscillation signal until receipt of the output signal and to provide a second count of the number of pulses in the second oscillation signal from receipt of the second oscillation signal until receipt of the output signal, wherein the pulse generator produces the trigger signals in response to receiving a pair of periodic signals generated externally to an integrated circuit, and wherein the first count and the second count are indicative of relative jitter associated with the pair of periodic signals.

5. The apparatus of claim 4 wherein the detector provides the output signal when leading edges of the first and the second oscillation signals are in phase.

6. The apparatus of claim 4 wherein the detector provides the output signal when trailing edges of the first and the second oscillation signals are in phase.

7. The apparatus of claim 4 implemented using a field programmable gate array.

8. A system comprising:

a first integrated circuit to provide a periodic signal; and a second integrated circuit coupled to the first integrated circuit comprising:

a pulse generator to produce trigger signals in response to receiving an externally-generated periodic signal, an oscillator coupled to the pulse generator to generate a first and second oscillation signals in response to the trigger signals, a detector coupled to the oscillator to provide an output signal when the first and the second oscillation signals are in phase, and a counter coupled to the oscillator and the detector to receive the first and second oscillation signals and the output signal and to provide a first count of the number of pulses in the first oscillation signal from receipt of the first oscillation signal until receipt of the output signal and to provide a second count of the number of pulses in the second oscillation signal from receipt of the second oscillation signal until receipt of the output signal, wherein the pulse generator produces the trigger signals in response to receiving a pair of periodic signals generated externally to the second integrated circuit, and wherein the first count and the second count are indicative of relative jitter associated with the pair of periodic signals.

9. The system of claim 8 wherein the detector provides the output signal when leading edges of the first and the second oscillation signals are in phase.

10. The system of claim 8 wherein the detector provides the output signal when trailing edges of the first and the second oscillation signals are in phase.

11. The system of claim 8 wherein the second integrated circuit is implemented using a field programmable gate array.

* * * * *